(12) United States Patent
Pamarti et al.

(10) Patent No.: US 9,450,566 B2
(45) Date of Patent: Sep. 20, 2016

(54) SHARP PROGRAMMABLE FILTERS USING PERIODICALLY TIME-VARYING COMPONENTS

(71) Applicant: THE REGENTS OF THE UNIVERSITY OF CALIFORNIA, Oakland, CA (US)

(72) Inventors: Sudhakar Pamarti, Los Angeles, CA (US); Mansour Rachid, Los Angeles, CA (US); Babak Daneshrad, Encino, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 102 days.

(21) Appl. No.: 14/274,558

(22) Filed: May 9, 2014

(65) Prior Publication Data

US 2014/0333373 A1 Nov. 13, 2014

Related U.S. Application Data

(60) Provisional application No. 61/821,695, filed on May 9, 2013.

(51) Int. Cl.
*H03B 1/00* (2006.01)
*H03K 5/00* (2006.01)
*H04B 1/10* (2006.01)
*H03H 19/00* (2006.01)
(Continued)

(52) U.S. Cl.
CPC .................... *H03H 19/00* (2013.01)

(58) Field of Classification Search
CPC ............. H03H 11/1291; H03H 11/04; H03H 11/0422; H03H 2210/021; H03L 7/0805

USPC .......................................... 327/553–555, 558
See application file for complete search history.

(56) References Cited

U.S. PATENT DOCUMENTS 6,686,809 B2 * 2/2004 Nystrom et al. ............. 333/17.1
7,408,417 B2 * 8/2008 Fukusen ......................... 331/17
(Continued)

OTHER PUBLICATIONS

Rachid, M. "Filtering by Aliasing and its application to Reconfigurable Filtering and Compressive Signal Acquisition," University of CA Los Angeles, Dissertation submitted in partial satisfaction of requirements for Doctor of Philosophy in EE. (2013) pp. 1-116.

(Continued)

*Primary Examiner* — Quan Tra
(74) *Attorney, Agent, or Firm* — O'Banion & Ritchey LLP; John P. O'Banion

(57) ABSTRACT

A method and apparatus for selective programmable filtering using analog circuits with time-varying components (e.g., resistances, capacitances) is presented. An analog front end receives an electronic signal and filters said signal by a passive or active continuous-time filter, having a combination of equivalent memory-less (e.g., resistive) and memory (e.g., capacitive or inductive) elements. A variable resistor circuit allows switching through a range of values to control one or more of the equivalent resistances of the passive or active continuous-time filter. The variable resistors are controlled using a control circuit to periodically modulate the resistances in the continuous-time filter between periodic sampling instances, such as during analog to digital conversion. Such periodic modulation of the resistances in the continuous-time filter allows for the programming and enhancement of the selectivity of said filter.

20 Claims, 7 Drawing Sheets

(56) References Cited

U.S. PATENT DOCUMENTS 8,258,832 B2* 9/2012 Min .............................. 327/156
2005/0242873 A1* 11/2005 Chen et al. ................... 327/553
2010/0065720 A1* 3/2010 Raynor et al. ............. 250/201.1

OTHER PUBLICATIONS

Rachid, M. et al. "Filtering by Aliasing," Signal Processing, IEEE Transactions, Mar. 7, 2013, vol. 61, issue 9, pp. 2319-2327.

* cited by examiner

SHARP PROGRAMMABLE FILTERS USING PERIODICALLY TIME-VARYING COMPONENTS

CROSS-REFERENCE TO RELATED APPLICATIONS

This application claims the benefit of U.S. provisional patent application Ser. No. 61/821,695 filed on May 9, 2013, incorporated herein by reference in its entirety.

STATEMENT REGARDING FEDERALLY SPONSORED RESEARCH OR DEVELOPMENT

Not Applicable

INCORPORATION-BY-REFERENCE OF COMPUTER PROGRAM APPENDIX

Not Applicable

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. §1.14.

BACKGROUND

1. Technical Field

The disclosed technology pertains generally to analog filter circuits, and more particularly to programmable analog filter circuits.

2. Discussion

State-of-the-art reconfigurable or programmable receivers still rely on: (a) traditional continuous-time (CT), integration sampling (IS), or discrete-time (DT) active filters at baseband and (b) low-selectivity passive filters at Radio Frequency (RF).

The traditional continuous-time (CT) or discrete-time (DT) active filters at baseband have a number of drawbacks, including: (1) that sharp CT analog filters are costly to integrate on chip, and (2) DT filters require increased chip area and power to provide limited bandwidth re-configurability. Integration sampling (IS) offers clock-programmable bandwidth. However, this alternative suffers from a slow roll-off and requires additional CT and/or DT stages to achieve selectivity.

At RF, passive filters based on impedance translation offer some degree of bandpass frequency and bandwidth programmability, combined with a large dynamic range, which improves on traditional fixed RF filters. Such RF passive filters, however, have two main drawbacks: (1) very weak selectivity that necessitates the employment of costly active subsequent filtering stages, and (2) limited harmonic cancellation that limits the range of carrier frequency programmability.

Accordingly, a need exists for an analog filter design which can be readily implemented at low power consumption levels even while providing sharp selectivity and high programmability.

BRIEF SUMMARY

An apparatus and method have been developed which significantly enhances selectivity of analog filter circuits, passive or otherwise, by periodically modulating its behavior utilizing variable components. In one embodiment, the technology can be applied to a simple passive single-pole RC filter by periodically varying its resistor at some rate $F_S$ to provide sharp passive programmable filtering at periodic instances $n/F_S$. The variation in the value of the resistor can be designed using optimization techniques and implemented using passive switched-resistor networks. The presented filter apparatus is particularly well-suited for use in low-cost programmable and sharp filtering at radio-frequency, intermediate-frequency, or baseband stages of a communications receiver as well as other applications that require sharp programmable analog filtering. The technology presented herein can potentially enable truly reconfigurable software-defined and cognitive radio receiver front-ends.

Further aspects of the technology will be brought out in the following portions of the specification, wherein the detailed description is for the purpose of fully disclosing preferred embodiments of the technology without placing limitations thereon.

BRIEF DESCRIPTION OF THE SEVERAL VIEWS OF THE DRAWING(S)

The technology will be more fully understood by reference to the following drawings which are for illustrative purposes only:

DETAILED DESCRIPTION

1. Introduction.

Sharp programmable analog filters are described which are based on circuits with time-varying component(s). Unlike previously known filter techniques, the technology presented herein can simultaneously provide passive, reconfigurable, and highly selective filtering which is particularly well-suited for use in baseband, intermediate frequency, and radio frequency stages of communications applications.

Filters taught according to the technology presented herein, are configured for periodically modulating one or more components of an analog filter circuit between periodic sampling instances. In effect, the impulse response of the filter is modulated to both program it and enhance its performance. In one embodiment, a continuous-time passive filter circuit is demonstrated which utilizes memory elements in the circuit itself to accumulate the output signal, unlike analog finite-impulse-response or integration sampling solutions which must rely on active elements to accumulate a programmable filter response.

Filters as taught herein can be applied in numerous ways to perform filtering at any frequency range approaching 0 Hz, through a radio frequency range. It will be appreciated that the electronic signal being filtered may be received from an antenna or other signal source coupled to the filter apparatus, or obtained from preceding circuitry.

The described programmable filter may be incorporated in the radio-frequency (RF), or intermediate-frequency (IF), or baseband frequency stages of a communications device, or combinations thereof. One or more of the described filters may be utilized within a reconfigurable software-defined radio in which the signals of interest to the radio are determined at runtime. One or more of the described filters may be utilized within a cognitive radio which detects existing signals of interest in a wideband spectrum and identifies empty signal spectra for access. It should also be recognized that the filters presented herein may be utilized separately, or in various combinations, including but not limited to use in (a) an interleaved manner to provide multi-phase outputs, (b) in a parallel manner to comprise a filter-bank; (c) as an analog front end of a digital to analog converter, or (d) any desired combinations thereof.

By way of example and not limitation, the present filter technology can be realized as a passive resistor-capacitor (RC) circuit with a time-varying resistor. At least one embodiment described herein, demonstrates application in a switched-resistor passive RC filter both for baseband (low-pass) and intermediate or radio frequencies (band-pass). The following section describes the underlying fundamentals of the technique.

2. Theory of Operation.

Figure 1:
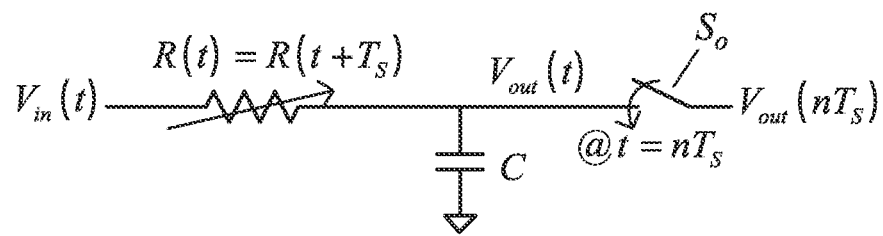
FIG. 1 is a schematic block diagram of an enhanced RC anti-aliasing filter according to an embodiment of the disclosed technology.

FIG. 1 illustrates an example embodiment of a linear time-varying RC, showing voltage input $V_{in}(t)$ with respect to time, a series variable resistance $R(t)=R(t+T_S)$, a capacitor C coupled to ground (i.e., charge storage capacitor), with the series output $V_{out}(t)$ passing through a switch $S_O$ having an operation where $t=nT_S$ to produce output $V_{out}(nT_S)$. The voltage across the capacitor at any time t is given by the following equation:

$$V_{out}(t) = V_{in}(t) - R(t)C \frac{dV_{out}(t)}{dt} \qquad (1)$$

If the resistance is varied periodically at the same period $T_S$ as the sampler, i.e., $R(t)=R(nT_S+t)$, the continuous-time(CT) filter exhibits a linear periodically time-varying response and appears linear and time invariant (LTI) at the sampling instances. It should be appreciated, that from the perspective of the output samples, the circuit appears to be LTI.

To design the LTI response of the RC filter apparent at the sampling instances, a person skilled in the art can describe the apparent LTI response in a number of optimizable forms, where the optimization variable is the time-varying resistance R(t). One possible approach is to resort to a discrete-time (DT) approximation. Assuming that R(t) is band-limited, the CT filter and sampler in FIG. 1 can be approximated in DT.

Figure 2:
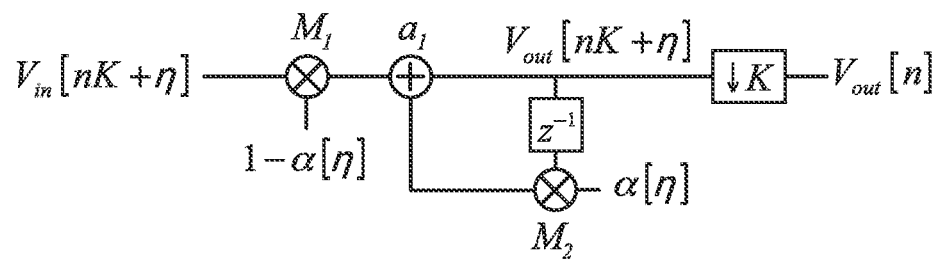
FIG. 2 is a schematic block diagram of a DT approximation of the RC anti-aliasing filter of FIG. 1 for the purpose of designing the resistance variation, according to an embodiment of the disclosed technology.

FIG. 2 illustrates approximation of the CT filter and sampler by a highly oversampled DT filter and decimator. This approximation serves simply to describe the filter performance in terms of the resistance R(t). The behavior of the single-pole CT filter, whose pole is given by the RC pair in FIG. 1, R(t) being time-varying, is approximated by the single-pole DT filter, whose pole is given by the variable $\alpha[\eta]$ in FIG. 2. Mathematically, $\alpha[\eta]$ is related to the RC pair according to equation (3). In FIG. 2, the gain of the DT filter is normalized to unity, to match that of the CT filter, with input $V_{in}[nK+\eta]$ received at multiplier $M_1$ with input multiplied by $(1-\alpha[\eta])$. The sample index $\eta$ corresponds to the approximation rate KFs, much greater than Fs, while sample index $\eta$ corresponds to the final sampling rate Fs. A feedback path is seen in FIG. 2 which feeds back a scaled previous portion of $V_{out}[nK+\eta]$ obtained by passing $V_{out}[nK+\eta]$ through a delay element $z^{-1}$ and multiplying it by $\alpha[\eta]$ at multiplier $M_2$. The fed back value is added to the input $V_{in}[nK+\eta]$ at an adder $a_1$ (sum junction). The decimator $\downarrow K$ approximates the sampler of FIG. 1 by reducing the rate from the oversampled rate KFs to the final rate Fs. Equation (1) can then be approximated by equation (2), where $\alpha$ is given by equation (3):

$$V_{out}[nK+\eta] = (1-\alpha[\eta])v_{in}[nK+\eta] + \alpha[\eta]V_{out}[nK+\eta-1] \qquad (2)$$

$$\alpha[\eta] = \frac{R(\eta\Delta t)C}{\Delta t + R(\eta\Delta t)C} \Delta t = \frac{T_S}{K} \qquad (3)$$

By expanding equation (2), the LTI frequency response H(z) of the DT approximation of FIG. 2, from the perspective of the decimated output, is given by the following equation:

$$H(z) = \frac{\sum_{\eta=0}^{K}(1-\alpha[\eta])\left(\prod_{i=1}^{\eta-1}\alpha[i]\right)z^{-\eta}}{1-\left(\prod_{\eta=1}^{K}\alpha[\eta]\right)z^{-K}} \qquad (4)$$

From equation (4), it is apparent to a person skilled in the art that H(z) is significantly more selective than a single-pole filter response, such as the response under a fixed, time-invariant $\alpha[\eta]$.

By designing the DT filter response in equation (4) for a desired frequency response, we can compute the corresponding $R(\eta\Delta t)$ using equation (3). In the results shown here, convex optimization and spectral factorization are used to find the optimal squared magnitude of $|H(z)|$ and the corresponding minimum phase H(z) respectively. The numerator of H(z) can then be scaled such that all α[η] belong to [0, 1). R(ηΔt) is then computed and interpolated.

3. Low-Pass Filtering.

Figure 3A:
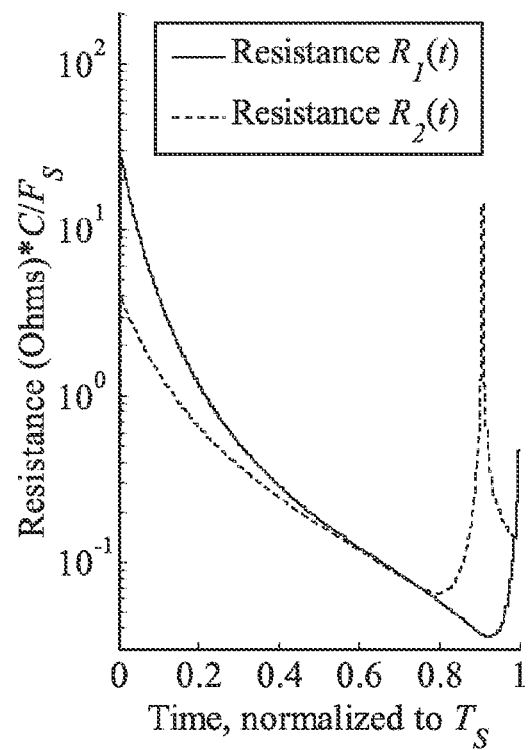
FIG. 3A and FIG. 3B are time-varying resistance and frequency response plots, respectively, for a passive switched-resistor filter according to an embodiment of the disclosed technology.
Figure 3B:
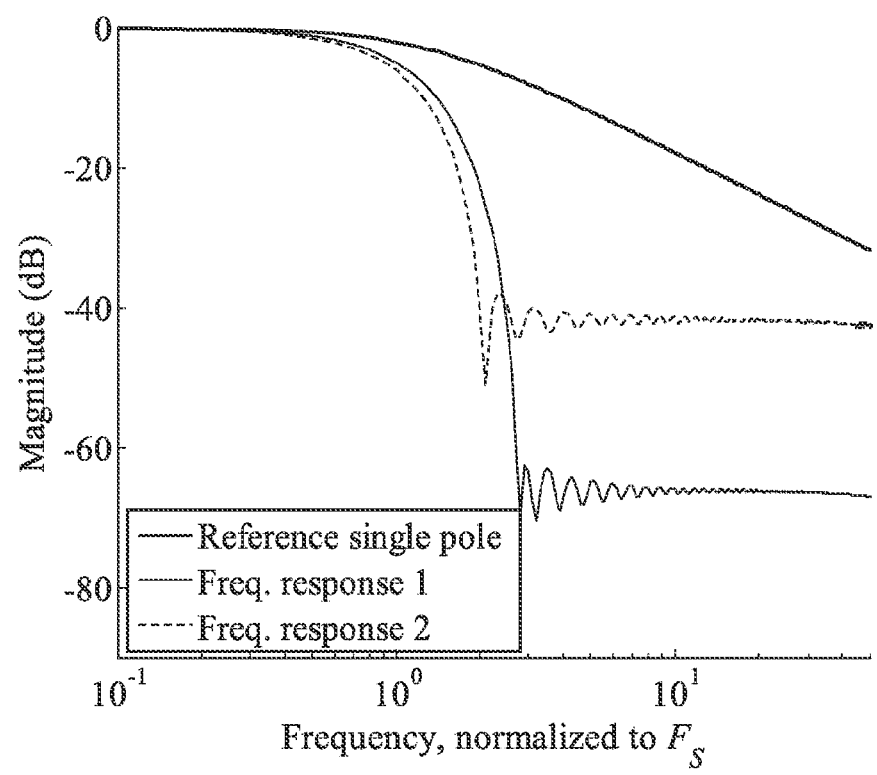

FIG. 3A and FIG. 3B depict two examples of optimal R(t) (one period) in FIG. 3A, and the corresponding anti-aliasing frequency responses of the RC filter in FIG. 3B. The plotted values of R(t) are scaled by the sampling rate FS and the capacitance C. It should be seen in FIG. 3B, that a very sharp filtering can be achieved with a controllable trade-off between stop-band suppression and filter roll-off.

Figure 4:
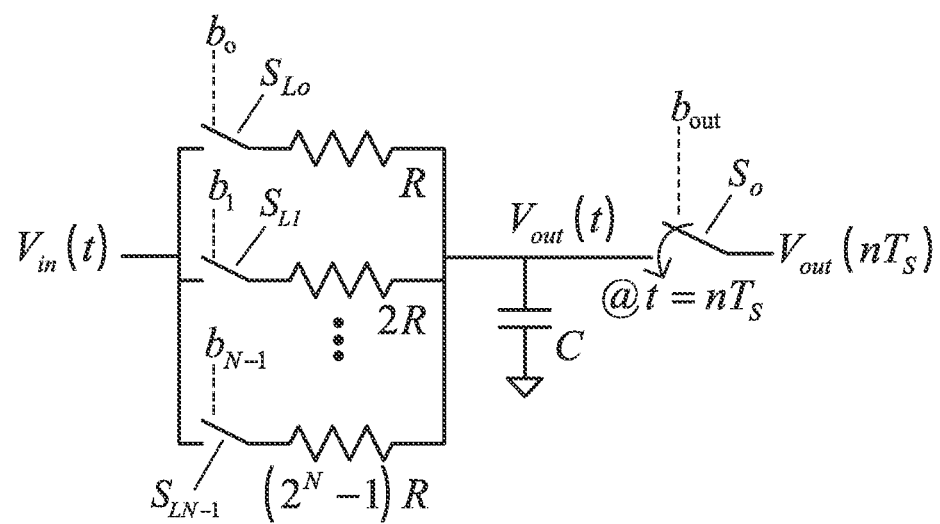
FIG. 4 is a schematic block diagram of a binary-weighted switched realization of the enhanced RC anti-aliasing filter shown in FIG. 1, according to an embodiment of the disclosed technology.

FIG. 4 illustrates an embodiment of switched parallel resistors in a switched RC filter network. Within the clock-programmable environment of SDRs, the variable R(t) can be practically realized as a parallel network of resistors (e.g., binary-weighted resistors, or other configurations) as shown in FIG. 4. In this figure, one sees a voltage input $V_{in}(t)$ with respect to time, received at multiple parallel switched resistors, shown with switch $S_{L0}$ in combination with resistance R, switch $S_{L1}$ in combination with resistance 2R, on through any number of switched resistor paths to switch $S_{LN-1}$ in combination with resistance $(2^N-1)R$. It should be appreciated that embodiments of FIG. 4 may be alternatively implemented with different (e.g., non-binary) relationships between the successive resistors, without departing from the teachings of the present disclosure. It will be seen in the figure that switch $S_{L0}$ is driven (controlled) by signal $b_0$, while switch $S_{L1}$ is driven by signal $b_1$, and final switch $S_{LN-1}$ is driven by signal $b_{N-1}$. It should be appreciated that the control signals described for this and other embodiments can be generated by any desired form of digital control circuitry, such as those known to one of ordinary skill in the art, and thus they are not discussed herein. The switched parallel resistors shown in FIG. 4 are coupled to a capacitor C which is coupled to ground, with the series output $V_{out}(t)$ passing through a switch $S_O$ having an operation where $t=nT_S$ to produce output $V_{out}(nT_S)$. It will be seen that operation of switch $S_O$ is controlled by a signal $b_{OUT}$. If the control voltages are switched at some rate LFs, the rate-LFs switching creates images of the filter pass-band at multiples of LFs, such images are, however, suppressed at a 20 dB per decade roll-off.

Figure 5A:
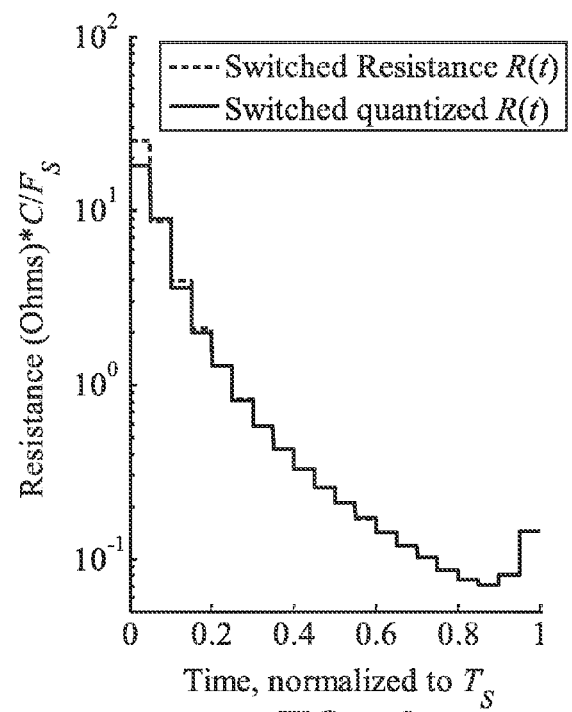
FIG. 5A and FIG. 5B are time-varying resistance and frequency response plots, respectively, for the passive switched-resistor filter embodiment of FIG. 4 according to an embodiment of the disclosed technology.
Figure 5B:
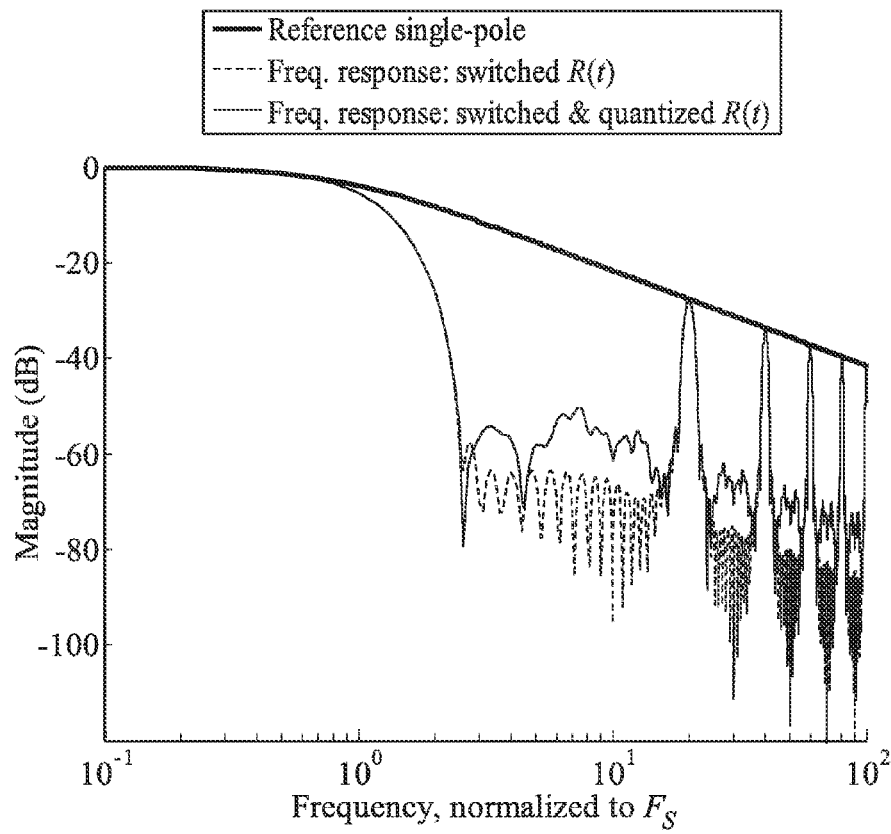

FIG. 5A and FIG. 5B depict switching and frequency response, respectively, for an example switched RC network. In FIG. 5A, is seen a switched R(t) curve in dashed lines, as well as a switched and quantized version in the solid line. The quantized case refers to a finite number (e.g., 8 in this example) of parallel resistors in FIG. 4. It will be seen that both curves are shown switched in this example version at 20 Fs, while the solid curve is also quantized in this example to 8-bits. Other switching rates and quantization levels can be utilized without departing from the disclosed teachings. FIG. 5B depicts corresponding frequency responses of the switched RC network. Notice that an 8-bit resolution in R(t) is sufficient to provide greater than 50 dB of stop-band suppression. Stop-band suppression can be further improved, for the same control signal resolution, by using dithering methods, such as prior to quantization.

4. Band-Pass Filtering.

If H(z) in equation (4) is designed as a bandpass filter, then the filter impulse response would be modulated by the carrier frequency. To achieve such modulation, one implementation may utilize a passive ±1 mixer.

Figure 6:
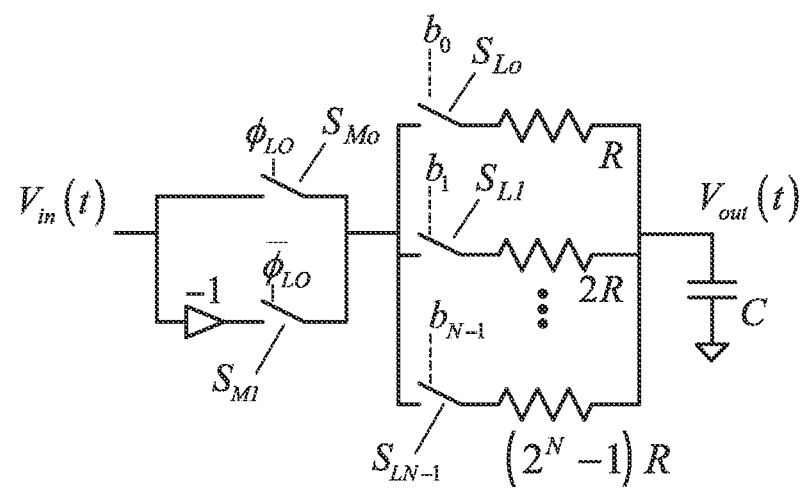
FIG. 6 is a schematic block diagram of a band-pass enhanced RC filter shown utilizing a mixer according to an embodiment of the disclosed technology.

FIG. 6 illustrates an example embodiment of a band-pass enhanced filter. In this figure, one sees a voltage input $V_{in}(t)$ with respect to time, into a mixer allowing selection of a first path (non-inverting) to switch $S_{M0}$, or through an inverse (−1) second path to switch $S_{M1}$. For generalization, the figure illustrates the inverting path as a gain of (−1) while a practical implementation would typically realize the sign inversion using only passive switching of differential inputs. The mixer switches are controlled by signal $\phi_{LO}$ and its inverse $\bar{\phi}_{LO}$, so that the switches are alternatively activated in performing the mixing. Output from the mixer (non-inverted or inverted signal) is received in a parallel switched-resistor section. The parallel switched resistor segments are shown with a switch $S_{L0}$ (controlled by signal $b_0$) in combination with resistance R, along with switch $S_{L1}$ (controlled by signal $b_1$) in combination with resistance 2R, on through to switch $S_{LN-1}$ (controlled by signal $b_{N-1}$) in combination with resistance $(2^N-1)R$. It should be appreciated that embodiments of FIG. 6 may be alternatively implemented with different (e.g., non-binary) relationships between the successive resistors, without departing from the teachings of the present disclosure. The switched multiple parallel resistors of FIG. 6 are shown connected to a capacitor C that is coupled to ground, with the series output $V_{out}(t)$ shown.

It should be appreciated that the passive ±1 mixer is utilized to provide the sign alternation while R (ηΔt), computed from |α[η]| of the intended bandpass filter, provides both the filter impulse response and the envelope of the carrier sinusoid. Accordingly, if R(t) is switched at M times faster than the carrier frequency, M-phase harmonic rejection would be inherently provided by the RC bandpass filter without any active gain components.

In reference to the above circuit, it should be appreciated that all carrier harmonics that occur below half the switching rate of R(t) are suppressed. A variable band-pass filter center frequency can thus be made arbitrarily low without compromising stop-band performance across the band of interest.

Figure 7A:
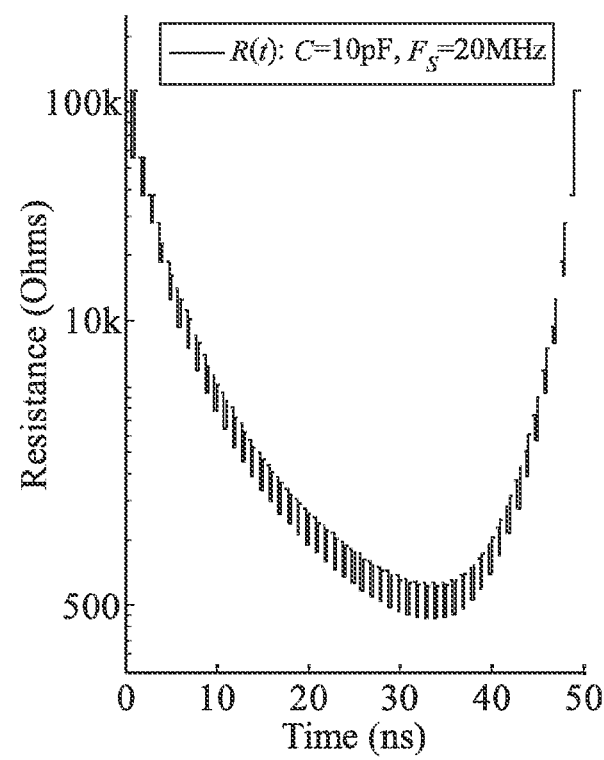
FIG. 7A and FIG. 7B are resistance and frequency response plots, respectively, for the band-pass enhanced RC filter embodiment of FIG. 6 according to an embodiment of the disclosed technology.
Figure 7B:
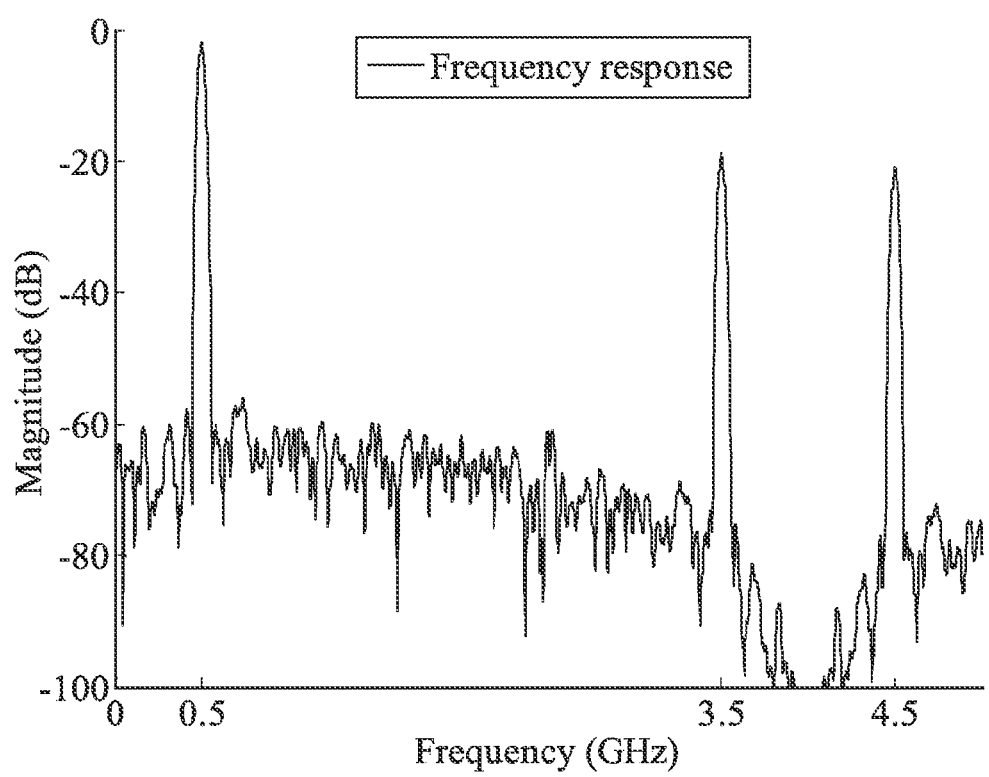

FIG. 7A and FIG. 7B illustrate an example numerical band-pass filter embodiment. By way of example and not limitation, the example shows in FIG. 7A an 8-bit quantized and 8-phase switched R(t) designed for a 20 MHz-bandwidth filter at a center frequency of 500 MHz. Given a 10 pF capacitor, R (t) ∈ [500Ω, 100 kΩ], FIG. 7B depicts a frequency response plot showing sharp bandpass filtering with 60 dB suppression up to approximately 3.5 GHz.

5. Extensions and Implications.

Beyond the application of the present technique to an RC filter prior to a rate-Fs sampler, it is important to note each of the following extensions and implications of the technology.

A. Multiple sampling channels, such as the switched-resistor RC filter described above, can be utilized in an interleaved manner to provide multi-phase outputs for: (a) approximating a continuous-time filtered output (higher rate than the signal bandwidth), and/or (b) further enhancing the filter sharpness (potentially arbitrarily sharp) by lengthening the modulation period of the resistor as compared to the desired final sampling period.

B. Multiple realizations of the technology, such as the switched-resistor RC realization described above, can be used in a parallel and independent manner to provide multiple channel (multi-channel) outputs for: (a) a multi-channel or multiple-signal (multi-signal) software defined receiver; and/or (b) a channelized, or filter-bank, analog to digital converter.

C. The techniques described herein can be similarly applied to any network of RLC elements or equivalents, where one or more elements are periodically time-varied to modulate the impulse response of the network similar to the RC case, for both enhanced filtering performance and programmability.

Figure 8A:
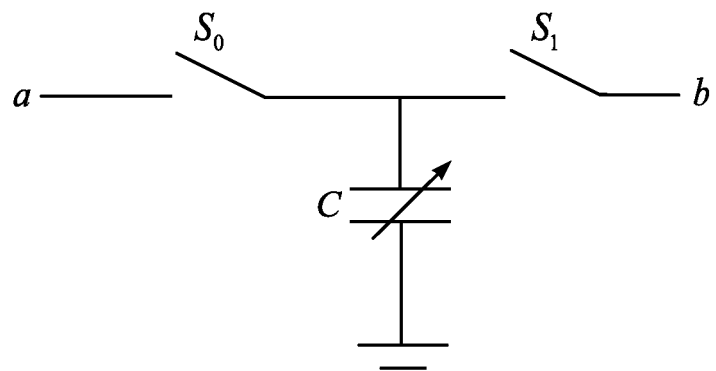
FIG. 8A through FIG. 8C are schematic block diagrams and waveforms, respectively, showing the use of a variable capacitance circuit in FIG. 8A, driven by switching waveforms shown in FIG. 8C, to operate equivalently to a variable resistor circuit in FIG. 8B.
Figure 8B:
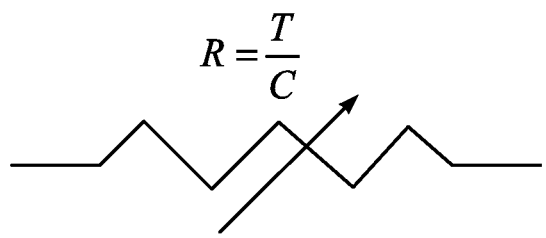
Figure 8C:
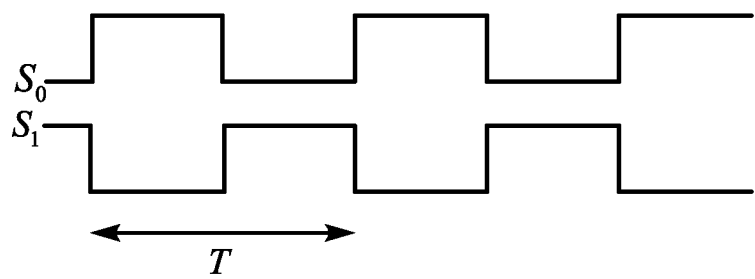

FIG. 8A through FIG. 8C illustrate an example embodiment of a sharp programmable filter, in which components other than the resistors are time varying. It will be realized that the sharp programmable filters described herein are not limited to being implemented as continuous-time filters as can be easily inferred from the derivation. A discrete-time analog filter circuit, such as a switched capacitor filter, can also be made programmable and more frequency selective (sharp) by periodically varying its elements. For example, FIG. 8A depicts that a resistance value of R can be equivalently realized between any two circuit nodes a and b and can be equivalently realized using a so-called "switched capacitor resistor." The figure depicts a grounded capacitor of value C that is alternatively connected (switched), by switches $S_0$ and $S_1$, to nodes a and b periodically with period T=RC. Accordingly, the variable capacitor circuit of FIG. 8A can be utilized equivalently in place of the variable resistor as seen in FIG. 8B. FIG. 8C depicts example switching waveforms for FIG. 8A. By way of example and not limitation, the desired resistor variation shown in FIG. 5A could then be simply realized using a variable switched capacitor resistor with T=1/LFs and C[n]=T/R[n].

D. The technique is not limited to passive filters as can be easily inferred from the derivation. The passive application is of particular interest, however, because of the reduced power consumption and enhanced linearity obtained while providing sharp programmable filtering.

6. Modes for Practicing the Disclosed Technology.

Some preferred modes for practicing the technology include the following. (1) The technology can be practiced using circuits similar to those illustrated in FIG. 4 and FIG. 6 for low-pass and band-pass anti-alias filtering, respectively. (2) The technology can be practiced in an interleaved structure of multiple realizations of a filter for low-pass and band-pass anti-alias filtering, with enhanced selectivity, filter-bank operation, multiple-channel (multi-channel) reception, and/or multiple-phase (multi-phase) outputs. (3) The technology can be practiced as the load impedance of an analog component, such as an LNA providing very sharp filtering at periodic instances, suitable for placing a sampler immediately at the output of an LNA.

From the description herein, it will be appreciated that that the present disclosure encompasses multiple embodiments which include, but are not limited to, the following:

1. An apparatus for performing sharp programmable filtering, comprising: an analog front end configured for receiving an electronic signal prior to analog to digital conversion; a passive or active continuous-time filter, having equivalent combination of resistor and capacitor (RC) filtering elements, within said analog front end; a variable equivalent resistor circuit in which said equivalent resistance of said passive or active continuous-time filter can be varied or switched through a range of values; and a control circuit for changing the value of said variable equivalent resistor circuit to periodically modulate the resistance of said equivalent resistance in said continuous-time filter between periodic sampling instances during analog to digital conversion; wherein said control circuit periodically varies the resistive contribution of said equivalent resistance in said passive or active continuous-time at a selected rate $F_S$, or period $1/F_S$ to provide programmable filtering at periodic instance $n/F_S$.

2. An apparatus for performing sharp programmable filtering, comprising: an analog front end configured for receiving an electronic signal prior to analog to digital conversion; a passive or active continuous-time filter, comprising a combination of equivalent memory-less elements which are resistive or conductive, and memory elements which are capacitive or inductive, within said analog front end; one or more of said equivalent resistive or conductive elements as variable or switched resistive or conductive circuits having equivalent resistance or conductance configured for being varied through a range of values; and a control circuit for said switched or variable equivalent resistive or conductive elements to periodically modulate their equivalent resistance or conductance in said continuous-time filter between periodic sampling instances; wherein said control circuit periodically varies the resistive or conductive contribution of said equivalent resistive or conductive elements in said passive or active continuous-time filter at a selected rate $F_S$, or period $1/F_S$, to provide programmable filtering at periodic instances $n/F_S$.

3. An apparatus for performing sharp programmable filtering, comprising: an analog front end configured for receiving an electronic signal prior to analog to digital conversion; a passive or active continuous-time filter, comprising a combination of equivalent memory-less elements which are resistive or conductive, memory elements which are capacitive or inductive, and gain elements within said analog front end; one or more of said elements having equivalent resistance, conductance, capacitance, inductance, or gain configured for being varied through a range of values; and a control circuit for said switched or variable elements to periodically modulate their equivalent values in said continuous-time filter between periodic sampling instances; wherein said control circuit periodically varies said equivalent resistance, conductance, capacitance, inductance, or gain at a selected rate $F_S$, or period $1/F_S$, to provide programmable filtering at periodic instances $n/F_S$.

4. An apparatus for performing sharp programmable filtering, comprising: an analog front end configured for receiving an electronic signal prior to analog to digital conversion; a passive or active discrete-time filter, comprising a combination of switched capacitive and gain elements within said analog front end; one or more of said elements having equivalent capacitance or gain configured for being varied through a range of values; and a control circuit for said switched or variable capacitive or gain elements to periodically modulate their equivalent values in said discrete-time filter between periodic decimation instances; wherein said control circuit periodically varies said equivalent capacitance or gain at a selected period of K discrete-time cycles, to provide programmable filtering at the periodic instances of nK discrete-time cycles.

5. The apparatus of any preceding embodiment, wherein one or more of said equivalent resistive, conductive, capacitive, inductive, or gain elements comprises variable or switched circuit whose equivalent resistance, conductance, capacitance, inductance, or gain can be varied through a range of values.

6. The apparatus of any preceding embodiment, wherein the switching or variation of the equivalent variable resistive, conductive, capacitive, inductive, or gain elements, of the same period $F_S$ as the sampler, is performed with timing resolution $1/KF_S$, K times faster than $F_S$.

7. The apparatus of any preceding embodiment, wherein said passive or active continuous-time filter in combination with said variable circuit elements and said control circuit modulate the impulse response of said passive or active continuous-time filter to both program it and enhance its performance.

8. The apparatus of any preceding embodiment, wherein said passive or active discrete-time filter in combination with said variable circuit elements and said control circuit modulate the impulse response of said passive or active discrete-time filter to both program it and enhance its performance.

9. The apparatus of any preceding embodiment, wherein periodically varying said resistive, conductive, capacitive, inductive, or gain contribution of the filter in a period that the signal is being sampled during analog to digital conversion causes said passive or active continuous or discrete-time filter to exhibit a linear and periodically time varying (LPTV) response that appears linear and time invariant (LTI) for each sample of analog to digital conversion.

10. The apparatus of any preceding embodiment, wherein said passive or active continuous-time filter is implemented with either passive filtering utilizing passive circuitry, or with active filtering that incorporates one or more active device elements.

11. The apparatus of any preceding embodiment, wherein said passive or active continuous-time filter utilizes inherent memory of an analog front end itself to accumulate an output signal, and does not rely on incorporating active elements to accumulate a filter response.

12. The apparatus of any preceding embodiment, further comprising a sign switching circuit for changing the sign of said electronic signal when said apparatus is configured for bandpass filtering.

13. The apparatus of any preceding embodiment, wherein said electronic signal is received from an antenna coupled to said apparatus, or is received from another signal source, which may include preceding circuitry, coupled to said apparatus.

14. The apparatus of any preceding embodiment, wherein said varying of said equivalent resistance, conductance, capacitance, inductance, or gain is determined using known optimization techniques.

15. The apparatus of any preceding embodiment, wherein said variable equivalent resistor circuit comprises a passive switched-resistor network.

16. The apparatus of any preceding embodiment, wherein said apparatus is configured for filtering at any frequency range between a baseband, approaching 0 Hz, on up through a radio frequency range.

17. The apparatus of any preceding embodiment, wherein said programmable filter is incorporated in the radio-frequency, or intermediate frequency, or baseband stages of a communications receiver, or within any combination of radio-frequency, intermediate frequency, and baseband stages of the communications receiver.

18. The apparatus of any preceding embodiment, wherein said apparatus is utilized within a reconfigurable software-defined radio in which variable signals of interest are determined at runtime.

19. The apparatus of any preceding embodiment, wherein said apparatus is utilized within a cognitive radio which detects existing signals of interest in a wideband spectrum, and identifies empty signal spectra for access.

20. The apparatus of any preceding embodiment, wherein said apparatus does not rely upon traditional continuous-time (CT) or discrete-time (DT) active filters at low baseband frequencies, or low selectivity passive filters at radio frequencies.

21. The apparatus in any of the previous embodiments, wherein said passive or active continuous-time filter may include inductor contribution (L), having equivalent combination of resistor, inductor and capacitor (RLC) filtering elements.

22. The apparatus of any preceding embodiment, wherein the apparatus comprises one stage within multiple stages that operate in an interleaved manner to provide multi-phase outputs.

23. The apparatus of any preceding embodiment, wherein the apparatus comprises one stage within multiple stages that operate in parallel within a filter bank.

24. The apparatus of any preceding embodiment, wherein the apparatus comprises an analog front end of an analog to digital converter.

25. A method of performing sharp programmable filtering in an analog front end configured for receiving an electronic signal prior to analog to digital conversion, comprising: periodically modulating the value of one or more circuit elements within a continuous-time or discrete-time filter between periodic sampling or decimation instances; wherein said filter is passive or active, and incorporates a combination of equivalent resistive or conductive elements which are memory-less, capacitive or inductive elements which have memory, and gain elements; performing programmable filtering at periodic instances $n/F_S$ in response to varying the resistive, conductive, capacitive, inductive, or gain contribution of said equivalent circuit elements in said continuous-time or discrete-time filter at a selected rate $F_S$.

Although the description herein contains many details, these should not be construed as limiting the scope of the disclosure but as merely providing illustrations of some of the presently preferred embodiments. Therefore, it will be appreciated that the scope of the disclosure fully encompasses other embodiments which may become obvious to those skilled in the art.

In the claims, reference to an element in the singular is not intended to mean "one and only one" unless explicitly so stated, but rather "one or more." All structural, chemical, and functional equivalents to the elements of the disclosed embodiments that are known to those of ordinary skill in the art are expressly incorporated herein by reference and are intended to be encompassed by the present claims. Furthermore, no element, component, or method step in the present disclosure is intended to be dedicated to the public regardless of whether the element, component, or method step is explicitly recited in the claims. No claim element herein is to be construed as a "means plus function" element unless the element is expressly recited using the phrase "means for". No claim element herein is to be construed as a "step plus function" element unless the element is expressly recited using the phrase "step for".

What is claimed is:

1. An apparatus for performing sharp programmable filtering, comprising:
    an analog front end configured for receiving an electronic signal prior to receipt by a sampler, or analog to digital converter;
    a passive or active continuous-time filter, comprising a combination of equivalent memory-less elements which are resistive or conductive, and memory elements which are capacitive or inductive, within said analog front end;
    one or more of said equivalent resistive or conductive elements as variable or switched resistive or conductive circuits having equivalent resistance or conductance configured for being varied through a range of values; and a control circuit for said switched or variable equivalent resistive or conductive elements to continuously vary their equivalent resistance or conductance in said continuous-time filter during the time period between successive sampling instances for the sampler or analog to digital converter;

wherein said control circuit continuously varies the resistive or conductive contribution of said equivalent resistive or conductive elements in said passive or active continuous-time filter in a repeating manner with a repetition rate $F_s$, or period $1/F_s$, to provide programmable filtering at periodic instances $n/F_s$, in which n is an integer value.

2. The apparatus recited in claim 1, wherein one or more of said equivalent resistive, conductive, capacitive, inductive, or gain elements comprises variable or switched circuit whose equivalent resistance, conductance, capacitance, inductance, or gain can be varied through a range of values.

3. The apparatus recited in claim 1, wherein the switching or continuous variation of the equivalent variable resistive, conductive, capacitive, inductive, or gain elements, of the same repetition period $F_s$ as a sampler, is performed in small time steps with timing resolution $1/KF_S$, K times faster than $F_S$.

4. The apparatus recited in claim 1, wherein said passive or active continuous-time filter in combination with said variable circuit elements and said control circuit modulate the impulse response of said passive or active continuous-time filter to both program it and enhance its performance.

5. The apparatus recited in claim 1, wherein continuously varying said resistive, conductive, capacitive, inductive, or gain contribution of the filter during the time period between periodic sampling instances $n/F_s$ and in a periodically repeating manner with repetition period $1/F_s$, causes said passive or active continuous or discrete-time filter to exhibit a linear and periodically time varying (LPTV) response that appears linear and time invariant (LTI) for each sample of analog to digital conversion.

6. The apparatus recited in claim 1, wherein said passive or active continuous-time filter is implemented with either passive filtering utilizing passive circuitry, or with active filtering that incorporates one or more active device elements.

7. The apparatus recited in claim 1, wherein said passive or active continuous-time filter utilizes inherent memory of an analog front end itself to accumulate an output signal, and does not rely on incorporating active elements to accumulate a filter response.

8. The apparatus recited in claim 1, further comprising a sign switching circuit for changing the sign of said electronic signal when said apparatus is configured for bandpass filtering.

9. The apparatus recited in claim 1, wherein said electronic signal is received from an antenna coupled to said apparatus, or is received from another signal source, which may include preceding circuitry, coupled to said apparatus.

10. The apparatus recited in claim 1, wherein said varying of said equivalent resistance, conductance, capacitance, inductance, or gain is determined using known optimization techniques.

11. The apparatus recited in claim 1, wherein said variable equivalent resistor circuit comprises a passive switched-resistor network.

12. The apparatus recited in claim 1, wherein said apparatus is configured for filtering at any frequency range between a baseband, approaching 0 Hz, on up through a radio frequency range.

13. The apparatus recited in claim 12, wherein said programmable filter is incorporated in the radio-frequency, or intermediate frequency, or baseband stages of a communications receiver, or within any combination of radio-frequency, intermediate frequency, and baseband stages of the communications receiver.

14. The apparatus recited in claim 1, wherein said apparatus is utilized within a reconfigurable software-defined radio in which variable signals of interest are determined at runtime.

15. The apparatus recited in claim 1, wherein said apparatus is utilized within a cognitive radio which detects existing signals of interest in a wideband spectrum, and identifies empty signal spectra for access.

16. The apparatus recited in claim 1, wherein said apparatus does not rely upon traditional continuous-time (CT) or discrete-time (DT) active filters at low baseband frequencies, or low selectivity passive filters at radio frequencies.

17. The apparatus recited in claim 1, wherein said passive or active continuous-time filter may include inductor contribution (L), having equivalent combination of resistor, inductor and capacitor (RLC) filtering elements.

18. The apparatus recited in claim 1, wherein the apparatus comprises one stage within multiple stages that operate in an interleaved manner to provide multi-phase outputs.

19. The apparatus recited in claim 1, wherein the apparatus comprises one stage within multiple stages that operate in parallel within a filter bank.

20. The apparatus recited in claim 1, wherein the apparatus comprises an analog front end of an analog to digital converter.

* * * * *